(12) United States Patent
Johnson

(10) Patent No.: US 8,777,775 B2
(45) Date of Patent: Jul. 15, 2014

(54) WHOLE MALLET PUTTER HEAD

(75) Inventor: Lyle Dean Johnson, Belmont, CA (US)

(73) Assignee: Lyle D. Johnson, Belmont, CA (US)

( * ) Notice: Subject to any disclaimer, the term of this patent is extended or adjusted under 35 U.S.C. 154(b) by 0 days.

(21) Appl. No.: 13/506,002

(22) Filed: Mar. 21, 2012

(65) Prior Publication Data

US 2012/0214609 A1 Aug. 23, 2012

Related U.S. Application Data

(62) Division of application No. 12/807,837, filed on Sep. 14, 2010, now Pat. No. 8,267,805.

(60) Provisional application No. 61/247,641, filed on Oct. 1, 2009.

(51) Int. Cl.
*A63B 53/04* (2006.01)
*A63B 47/02* (2006.01)

(52) U.S. Cl.
USPC .......................... 473/341; 473/286; 473/252

(58) Field of Classification Search
CPC .. A63B 47/02; A63B 53/007; A63B 53/0487; A63B 53/065; A63B 2053/0441; A63B 2053/0433
USPC ........................... 473/286, 340–341, 251–255
See application file for complete search history.

(56) References Cited

U.S. PATENT DOCUMENTS

| | | | | |
|---|---|---|---|---|
| 3,632,112 A | * | 1/1972 | Jacobs | 473/286 |
| 3,708,172 A | | 1/1973 | Rango | |
| 3,758,115 A | * | 9/1973 | Hoglund | 473/255 |
| 3,779,398 A | * | 12/1973 | Hunter | 473/249 |
| D256,262 S | * | 8/1980 | Benson | D21/745 |
| 4,962,931 A | * | 10/1990 | Jazdzyk, Jr. | 473/252 |
| 5,127,653 A | * | 7/1992 | Nelson | 473/249 |
| 5,131,656 A | * | 7/1992 | Kinoshita | 473/341 |
| 5,308,067 A | * | 5/1994 | Cook | 473/341 |
| D379,484 S | | 5/1997 | Solheim | |
| 5,683,307 A | | 11/1997 | Rife | |
| D396,082 S | | 7/1998 | Sheets | |
| D399,911 S | | 10/1998 | Nicolette | |
| 5,830,078 A | | 11/1998 | McMahan | |
| 6,273,831 B1 | * | 8/2001 | Dewanjee | 473/324 |
| 6,386,991 B1 | * | 5/2002 | Reyes et al. | 473/346 |
| D461,860 S | | 8/2002 | Tang | |
| 6,478,694 B2 | * | 11/2002 | Anderson et al. | 473/350 |

(Continued)

FOREIGN PATENT DOCUMENTS

JP 2007130203 A * 5/2007
JP 2007307334 A * 11/2007

*Primary Examiner* — Stephen L. Blau

(57) ABSTRACT

The mallet putter head in this present invention is comprised of a body cast in 304 stainless steel having a smooth putting face with a 3 degree loft and also balancing weights starting at the putter face and continuing to the rear curve of the putter head giving a proper look, weight and feel. There are three painted grooves perpendicular to the putter face to assist the golfer in aligning the putter to the intended line of the putt. A hole just smaller than a golf ball is also provided that will assist the golfer in aligning the putt. The sole of the putter is curved to permit easy movement of the putter head in the pendulum swing and also in or out in front of the body. The rear end of the putter allows the golfer to pick up a golf ball, if desired.

4 Claims, 6 Drawing Sheets

Top View

Rear View

(56) References Cited

U.S. PATENT DOCUMENTS

| | | |
|---|---|---|
| D474,821 S | 5/2003 | Wells |
| D485,321 S | 1/2004 | Breier |
| 6,692,378 B2 * | 2/2004 | Shmoldas et al. ............ 473/340 |
| 6,966,845 B2 | 11/2005 | Solheim |
| 7,086,959 B2 * | 8/2006 | D'Agguano ................... 473/282 |
| 7,223,178 B2 * | 5/2007 | Henry ........................... 473/252 |
| 7,270,609 B2 * | 9/2007 | Yamaguchi et al. .......... 473/341 |
| 7,281,987 B2 * | 10/2007 | Iwade ........................... 473/314 |
| D573,673 S * | 7/2008 | Noyes ........................... D21/736 |
| 7,922,596 B2 * | 4/2011 | Vanderbilt et al. ............ 473/251 |
| 2004/0147334 A1 * | 7/2004 | D'Agguano ................... 473/286 |
| 2004/0209702 A1 * | 10/2004 | Charron et al. ............... 473/314 |
| 2004/0254028 A1 | 12/2004 | Souza |
| 2005/0020380 A1 * | 1/2005 | Yamaguchi et al. .......... 473/340 |
| 2005/0049078 A1 | 3/2005 | Yamanako |
| 2005/0221908 A1 * | 10/2005 | Gornall ......................... 473/285 |
| 2006/0019766 A1 | 1/2006 | Kubota |
| 2006/0223646 A1 * | 10/2006 | Rife .............................. 473/251 |
| 2010/0304878 A1 * | 12/2010 | Reichow et al. .............. 473/251 |

* cited by examiner

Top View

Face View

Rear View

Section A-A

Figure 1:
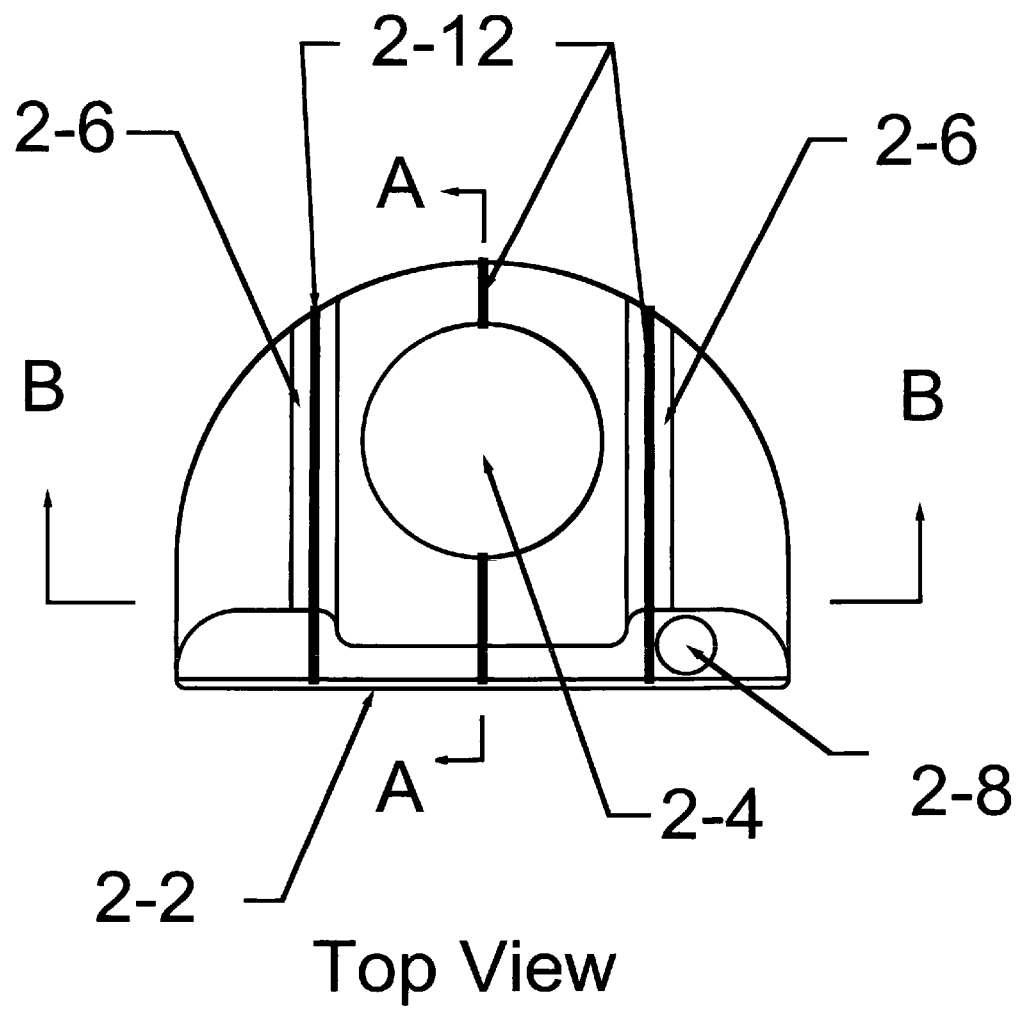

See Figure 1

Section B-B

See Figure 1

Profile

WHOLE MALLET PUTTER HEAD

CROSS-REFERENCE TO RELATED APPLICATIONS

This is a Divisional Patent Application of U.S. Application Ser. No. 12/807,837 filed 14 Sep. 2010 now U.S. Pat. No. 8,267,805 which claims the benefit of U.S. Provisional Patent Application Ser. No. 61/247,641 filed Oct. 1, 2009.

BACKGROUND OF THE INVENTION

1. Field of Invention

The present invention generally pertains to the development of a golf mallet putter head that can be used with a conventional hand putter, a belly putter and a chest putter.

2. Prior Art

There have been many mallet putter heads developed over the years each with their own characteristics in a variety of materials, shapes and sizes. See Information Disclosure Statement.

Objects and Advantages

A mallet putter head for use with a variety of putters like the standard hand putter, the belly putter and the chest putter requires several features that permit its use with each length putter. The primary action for the golfer in putting is the pendulum swing and the putter head needs to permit the pendulum swing characteristics. The first feature is the putter head weight. Having enough weight allows the golfer to feel the movement of the putter head enabling the golfer to adjust the length of the swing for the desired length of putt and putting surface conditions. The next feature is the curved sole of the putter head. Curvature in the sole from the putter face to the rear end of the mallet putter head allows the putter head to move over the putting surface with minimum contact and avoids drag against the grass. The curvature from the heel of the putter to the toe is designed to permit the golfer to place the ball closure or further from their standing position. Placing the ball directly below the eyesight is preferred, but not required. Another feature is the putter face wherein the surface is milled smooth with a three degree loft from heel to toe. The next feature is the distribution of weight which allows the golfer greater latitude in striking the ball near the center of the putter face. Weight is placed toward the outer edges behind the face between the heel and toe. Still another feature is the three painted grooves placed on the putter head that run perpendicular to the putter face to assist the golfer in aligning the putter head to the intended direction of the putt. An important feature in the center of the putter head is a hole also intended to assist the golfer in aligning the putt. Then another feature is the thickness at the rear of the putter head which allows the golfer to pick up the golf ball from the putting surface, if desired, and the hole also cradles the ball. All these features create a unique mallet head putter.

The mallet putter head is made of 304 stainless steel cast using investment casting. Next the putter head is milled to create the flat putter face and then the sole and face of the putter head are polished to a provide a smooth surface. The upper surface of the putter head is powder coated and the grooves are painted to match improving the golfer's sight of the putter head.

DRAWINGS FOR THE "WHOLE MALLET PUTTER HEAD"

FIG. 1—The whole mallet putter head. Top View

This top view shows the shape of the putter head, the balanced weight and ball guidance portion with a center hole, the raised bars and the painted grooves.

Figure 2:
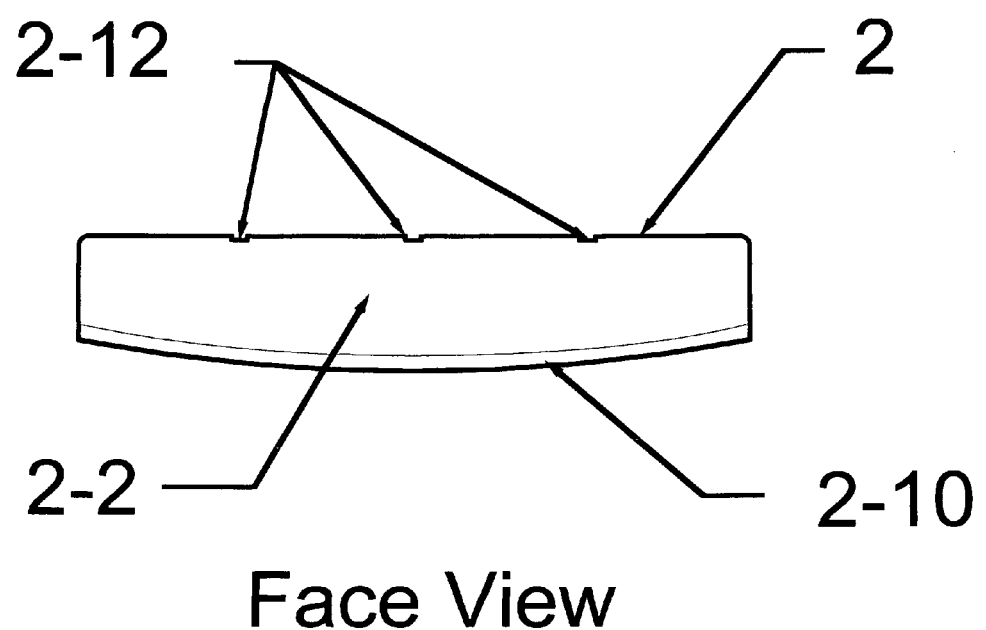

FIG. 2—The whole mallet putter head, Face View

This view shows the smooth putting surface, grooves and the curvature of the sole side to side.

Figure 3:
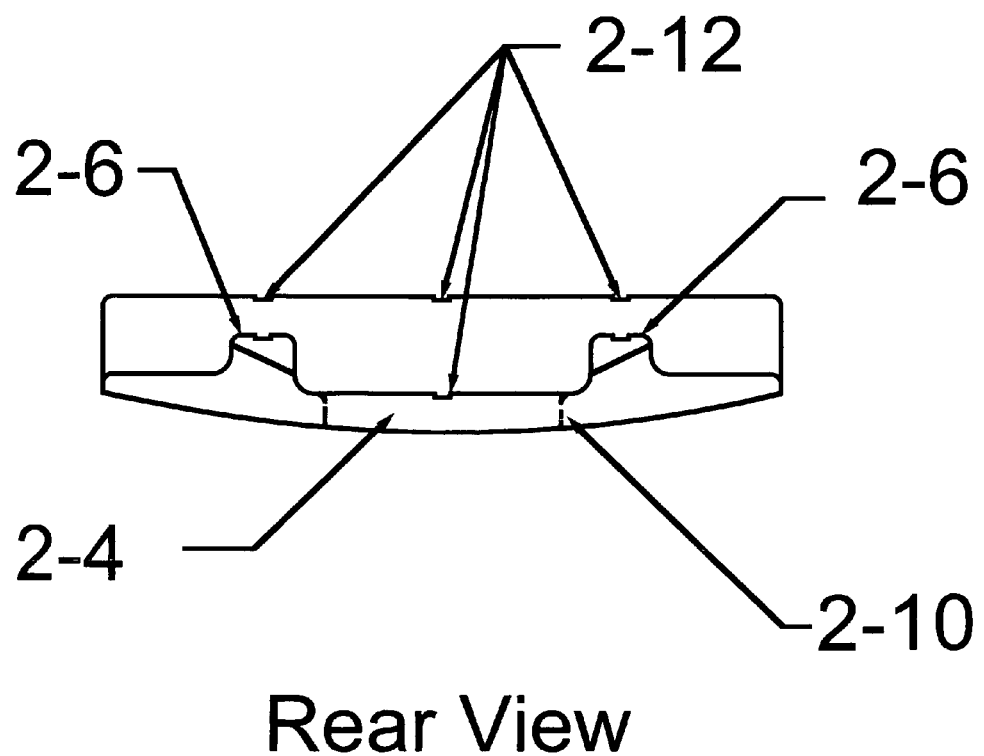

FIG. 3—The whole mallet putter head. Rear View

This view shows the raised bars, the ball pickup area and the center hole.

Figure 4:
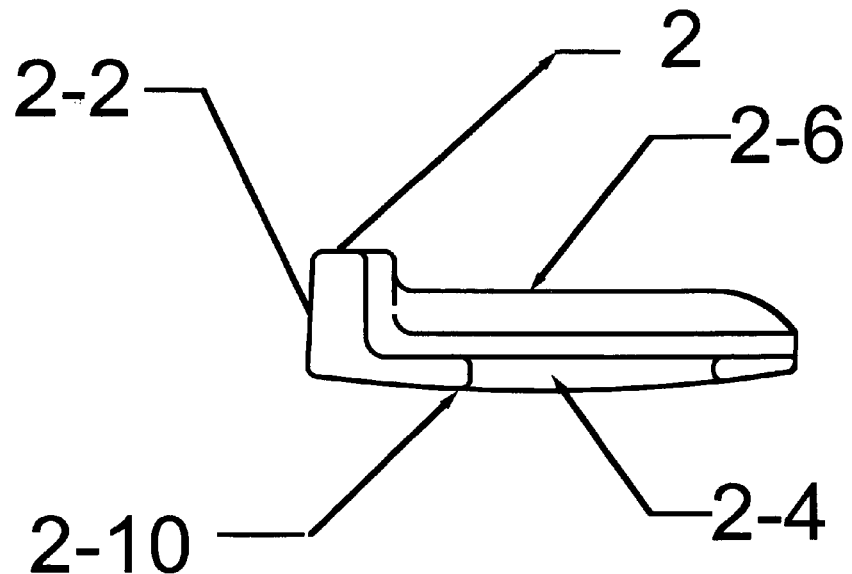

FIG. 4—The whole mallet putter head. Section A-A (See FIG. 1)

This section shows the curvature of the sole, face to ball pickup.

Figure 5:
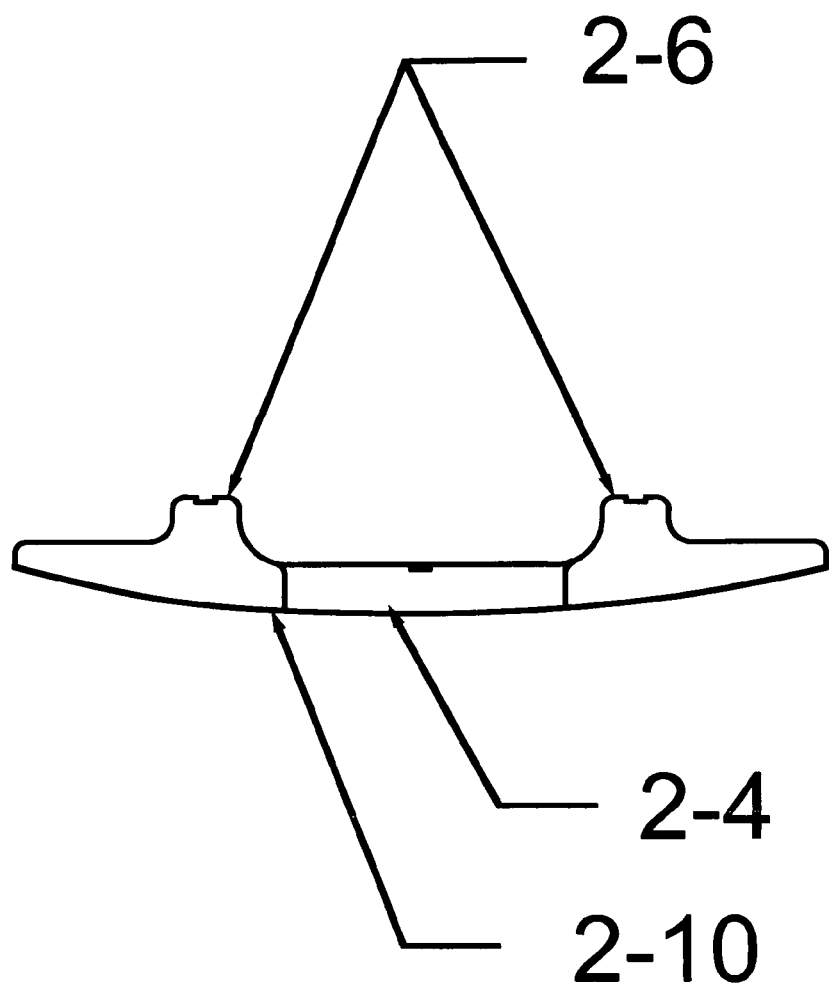

FIG. 5—The whole mallet putter head. Section B-B (See FIG. 1)

This section emphasizes the raised bars and the grooves in the putter.

Figure 6:
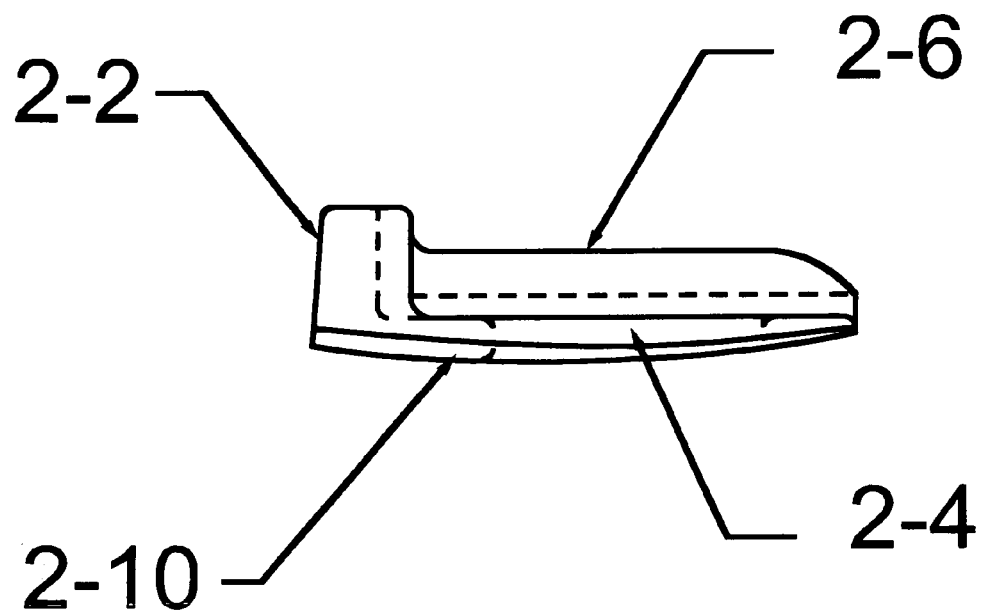

FIG. 6—The whole mallet putter head. Profile

The profile shows the loft of the face, the curvature of the sole, the ball pickup area, the raised bars and the center hole.

LIST OF REFERENCE NUMERALS

2 Putter Head
2-2 Putter Face
2-4 Hole for ball guide and pickup
2-6 Balancing weights and parallel strips for putt alignment
2-8 Hole for putter shaft
2-10 Sole of putter
2-12 Raised bars and Painted grooves

SUMMARY OF INVENTION

The mallet putter head 2 herein presented gives the golfer a unique opportunity to use the pendulum swing with any type of hand, belly or chest putter shafts currently in use. Golfers may still use other types of swing in striking the ball which is also improved with this mallet putter head. Special features like the curved sole, the smooth putter face, balanced weighting, guide lines, a hole for putt alignment and ball pickup making this mallet putter head very special.

Description

Main Embodiment

The putter head 2 is properly weighted and balanced for striking the ball with any type putter, hand, belly or chest. The putter head 2 balancing weights and parallel strips 2-6 and 2-12 along with the hole for ball guide 2-4 are designed to assist the golfer in aligning the putt when putter face 2-2 strikes the ball. The hole for the ball guide 2-4 is also used to secure the ball when being picked up after play is completed on the green. The putter head 2 is connected to a shaft using shaft epoxy in the hole 2-8 for the putter shaft, mounted in a vertical position. Any 0.370" shaft with a vertical mounting design can be used with this mallet putter head 2. The grooves in 2-6 and 2-12 are painted to improve visibility for the golfer. Sole 2-10 is curved face the rear to permit the pendulum swing minimizing contact with the putting surface. Sole 2-10 is also curved from heel to toe allowing the golfer to move the putter head 2 in and out in front of the golfer's stance again minimizing contact with the putting surface.

Operation

Main Embodiment

Each golfer is directed to place the putter head 2 as close to vertically below their eyesight and swing the putter head 2 along a path parallel to the intended line of the ball movement. In the use of a hand putter the path of the putter head may have a slight curve. A pendulum swing is common, but that is entirely up to the golfer. The parallel strips and the hole behind the putter face 2-2 are used to assist the golfer in maintaining the putter face 2-2 perpendicular to the line of the intended ball movement. The length of the putt is governed by the momentum created in the pendulum swing. The golfer will learn to swing the putter head, weighing approximately 390 grams, a sufficient distance back and through the strike plain to move the ball the desired distance.

CONCLUSION, RAMIFICATION, AND SCOPE

Each of the various manufacturing processes are preformed by different manufactures. {Investing casting, milling and polishing, and powder coating}

The putter head is affixed to the putter shaft using shaft epoxy applied by an experienced club maker.

I claim:

1. A mallet putter head comprising: a body having a face portion, a balanced weight and ball guidance portion with a center groove and raised bars, a ball pickup portion and a sole portion, all designed to work together as a unit in the pendulum putting swing, and where
   the face portion has a cast, milled and polished surface having a few degrees loft whereupon it allows the golf ball to be hit at or below the center of the golf ball giving it a forward roll reducing the chance of skidding or bouncing the golf ball and thereby improving its movement along the intended target line, and where
   the balanced weight and ball guidance portion, has three components that gives the golfer greater control when hitting the golf ball along the intended target line using the pendulum putting swing, with
   the first of these components being the balanced weight, with raised bars with painted grooves that extends from the face portion to the ball pickup portion at the rear of the mallet putter head, wherein this weight distribution gives the golfer a wider area near the center of the face portion to accurately hit the golf ball, then
   the second component, being the hole, comes into play because it allows the golfer to visualize hitting the golf ball at the apex of the hole directly behind the area where the golf ball is intended to be and where this point is also clearly marked by the center groove,
   three painted grooves make up the third component of the balanced weight and ball guidance portion, with two painted grooves along the center of the raised bars and the third painted groove along the center of the mallet putter head, running parallel to each other and perpendicular to the face portion producing clear guidance to the golfer to hit the golf ball on the intended target line, and next
   the ball pickup portion at the rear portion of the mallet body is cast, milled and polished thin, allowing the golfer to slip the mallet putter head under the golf ball causing it to roll back into the hole of the balance weight and ball guidance portion where it is cradled in the hole while the golfer raises the ball from the putting surface to be retrieved, and where
   the sole portion of the mallet putter head has a polished curved surface that is cast and milled to give the stainless steel a very smooth uniform curved surface, side to side and front to back of the entire sole portion so that the golfer when aligning the putt will be able to move the mallet putter head in or out from the body keeping it centered below their eyesight and also where the uniform curvature from the face portion to the ball pickup portion enables the golfer to maintain a constant arc throughout the pendulum putting swing, assuring minimal contact with the putting surface.

2. The mallet putter head according to claim 1 further has a weight of approximately 390 grams that gives the golfer better touch and feel for both long and short putts when using the standard hand putter, the belly putter or the chest putter, in the pendulum putting swing.

3. The mallet putter head according to claim 1 has a vertical hole on the top of the mallet putter head, just behind the face portion near the alignment groove, to receive a standard putter shaft that is secured with epoxy, giving the golfer excellent control in the pendulum putter swing.

4. The mallet putter head according to claim 1 is also cast, milled and polished perfectly straight and flat along the entire lofted face portion to further insure the golf ball will be hit along the intended target line and will also allow the golfer to polish or clean the face portion, if dirty, scratched or scared, as may if required.

* * * * *